United States Patent
Tomita et al.

(10) Patent No.: US 9,287,083 B2
(45) Date of Patent: Mar. 15, 2016

(54) CHARGED PARTICLE BEAM DEVICE

(75) Inventors: Shinichi Tomita, Hitachi (JP); Wataru Kotake, Hitachinaka (JP); Sukehiro Ito, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/979,964

(22) PCT Filed: Dec. 16, 2011

(86) PCT No.: PCT/JP2011/079166
§ 371 (c)(1),
(2), (4) Date: Jul. 16, 2013

(87) PCT Pub. No.: WO2012/101927
PCT Pub. Date: Aug. 2, 2012

(65) Prior Publication Data
US 2013/0299715 A1  Nov. 14, 2013

(30) Foreign Application Priority Data
Jan. 25, 2011  (JP) .................. 2011-012435

(51) Int. Cl.
*H01J 37/147* (2006.01)
*H01J 37/153* (2006.01)
*H01J 37/28* (2006.01)

(52) U.S. Cl.
CPC ........... *H01J 37/1478* (2013.01); *H01J 37/153* (2013.01); *H01J 37/28* (2013.01); *H01J 2237/1536* (2013.01); *H01J 2237/20207* (2013.01); *H01J 2237/2611* (2013.01)

(58) Field of Classification Search
CPC .................. H01J 2237/1506; H01J 2237/1507; H01J 2237/1534; H01J 2237/1536; H01J 2237/1537
USPC ........................ 250/369 R, 369 ML, 397–400
See application file for complete search history.

(56) References Cited

U.S. PATENT DOCUMENTS 5,338,839 A  8/1994  McKay et al.
5,414,261 A *  5/1995  Ellisman et al. ............... 250/311
(Continued)

FOREIGN PATENT DOCUMENTS

DE  2138766 A  3/1972
DE  3924605 A  2/1990
(Continued)

OTHER PUBLICATIONS

G. Nolze; "Image distortions in SEM and their influences on EBSD measurements", Ultramicroscopy 107 (2007) pp. 172-183.
(Continued)

*Primary Examiner* — Jack Berman
*Assistant Examiner* — Kevin Chung
(74) *Attorney, Agent, or Firm* — Mattingly & Malur, PC

(57) ABSTRACT

Provided is a charged particle beam device that is capable of suppressing an field-of-view deviation occurring when observing a tilted image or a left-right parallax-angle image acquired by irradiating a tilted beam on a sample while continuously compensating a focus. By means of an aligner for compensating field-of-view (54) installed between an objective lens (7) that focuses a primary charged particle beam on a surface of the sample (10), and a deflector for controlling tilt angle (53) that tilts the primary charged particle beam, the field-of-view deviation occurring during tilting of the primary charged particle beam is suppressed based on an amount of compensation required by a tilt angle of the deflector for controlling tilt angle (53), lens conditions, and a distance between the objective lens (7) and the sample (10), in conjunction with a focus compensation of the objective lens (7).

8 Claims, 10 Drawing Sheets

(56) References Cited

U.S. PATENT DOCUMENTS

| | | |
|---|---|---|
| 2001/0025925 A1 | 10/2001 | Abe et al. |
| 2005/0161601 A1* | 7/2005 | Kochi et al. .................. 250/311 |
| 2005/0236570 A1 | 10/2005 | Morokuma et al. |
| 2005/0253083 A1* | 11/2005 | Sato et al. .................... 250/398 |
| 2006/0033037 A1 | 2/2006 | Kawasaki et al. |
| 2007/0221860 A1 | 9/2007 | Kawasaki et al. |
| 2009/0212228 A1* | 8/2009 | Hirose et al. .............. 250/396 R |
| 2009/0218508 A1* | 9/2009 | Tamura et al. ............ 250/396 R |
| 2009/0322973 A1 | 12/2009 | Ito et al. |
| 2010/0181478 A1 | 7/2010 | Morokuma et al. |
| 2010/0264309 A1* | 10/2010 | Hirose et al. ................. 250/310 |

FOREIGN PATENT DOCUMENTS

| | | |
|---|---|---|
| JP | 60-200450 A | 10/1985 |
| JP | 2-33843 A | 2/1990 |
| JP | 5-258700 A | 10/1993 |
| JP | 2000-195453 A | 7/2000 |
| JP | 2001-273861 A | 10/2001 |
| JP | 2002-343293 A | 11/2002 |
| JP | 2005-122933 A | 5/2005 |
| JP | 2005-310602 A | 11/2005 |
| JP | 2006-54074 A | 2/2006 |
| JP | 2007-087971 A | 4/2007 |
| JP | 2008-282826 A | 11/2008 |
| JP | 2009-199904 A | 9/2009 |
| JP | 2010-9907 A | 1/2010 |
| JP | 2010-16007 A | 1/2010 |
| WO | 2009/015615 A1 | 2/2009 |

OTHER PUBLICATIONS

Korean Office Action received in Korean Application No. 10-2013-7018107 dated Mar. 21, 2014.

German Office Action received in corresponding German Application No. 11 2011 104 595.6 dated Feb. 25, 2015.

* cited by examiner

CHARGED PARTICLE BEAM DEVICE

TECHNICAL FIELD

The present invention relates to a charged particle beam device.

BACKGROUND ART

As a conventional technique to tilt a charged particle beam such as an electron beam or an ion beam on a sample and display a stereoscopic image by a tilted image display on the sample or by a left-right parallax-angle image data, for example, JP-A-2-33843 (Patent Literature 1) and JP-A-2010-9907 (Patent Literature 2) are disclosed. In Patent Literature 1, disclosed is a technique to tilt a charged particle beam at above an objective lens, use an off-axis swing-back action of the objective lens, tilt a charged particle beam on a sample for irradiation, and acquire a tilted image on the sample. Further, in Patent Literature 2, disclosed is a technique to perform a stereoscopic observation by using a charged particle beam device. In the techniques of the literatures, by using an electromagnetic coil, a charged particle beam tilted as much as a left-right parallax-angle is scanned on the sample, stereo pair images of left and right are acquired, and the acquired images are displayed on a 3D-LCD, thereby observing a stereoscopic image in real time.

As an example of a technique to correct a focus, an astigmatism, and a field of view occurring during tilting, JP-A-2010-16007 (Patent Literature 3) discloses. With regard to the astigmatism correction, a combination of a plurality of astigmatism correction values is evaluated to detect an optimum astigmatism correction value. With regard to field-of-view deviation, images before and after a tilt are compared to evaluate a of field-of-view deviation amount and corrected by an image shift or by moving a sample stage.

On the other hand, as a method for observing a sample in which a sample surface itself is tilted larger than the depth of a focus of a charged particle beam, there is used a tilted focus compensation (dynamic focus) function to continuously change the focus of the charged particle beam according to the sample surface tilt and provide an always-focused image. Further, there is used a tilted magnification compensation (tilt compensation) function to change the scan width of the charged particle beam according to the sample tilt angle and scan the charged particle beam on the same region as that before the tilt to acquire an image. These functions are already commercialized.

CITATION LIST

Patent Literature

Patent Literature 1: JP-A-2-33843
Patent Literature 2: JP-A-2010-9907
Patent Literature 3: JP-A-2010-16007

SUMMARY OF INVENTION

Technical Problem

When the charged particle beam is tilted at above an objective lens, the off-axis swing-back action of the objective lens is used, and the tilted charged particle beam is irradiated on a sample to observe the sample, field-of-view deviation occurs as compared to the case when the charged particle beam is not tilted. In a charged particle beam device as represented by an electron microscope, when a crossover above the objective lens that is located on the center of the optical axis is virtually shifted from the optical axis by tilting the charged particle beam. Through the process, field-of-view deviation normally appears as a product of this deviation amount and a reduction rate of the objective lens.

To avoid the above, a crossover method to tilt the charged particle beam at the crossover position is known, whereas limitations to device performance and mounting are heavy.

With these tilted image observation and stereoscopic image observation, when a sample is observed by using a sample stage with tilting the sample itself significantly, the focus can be continuously changed by using the tilted focus compensation (dynamic focus) function according to the sample tilt angle and a focused image can be acquired in the entire surface of the field-of-view based on the conventional technique. However, from a result of an extensive investigation, the inventors have found that when observing a tilted image, the field of view is significantly deviated from a predetermined position due to the field-of-view deviation in a range of high magnifications of 1000 times or more, and when observing a stereoscopic image, the field of view is deviated in both of the left-right parallax-angle images which is equivalent to observing different positions, and a situation occurs that the stereoscopic observation cannot be performed.

A first object of the present invention is to provide a charged particle beam device that can easily compensate the field-of-view deviation occurring by tilting a primary charged particle beam.

A second object of the present invention is to provide a charged particle beam device in which the field-of-view deviation is suppressed and a preferable stereoscopic image is acquired.

A third object of the present invention is to provide a charged particle beam device that is capable of observing a predetermined position through the tilted charged particle beam even if the sample is tilted.

Solution to Problem

As one embodiment for achieving the above object, the charged particle beam device includes a charged particle source, a plurality of lenses that converge a primary charged particle beam emitted from the charged particle source, a scan coil that scans the primary charged particle beam on a sample, an objective lens that converges the primary charged particle beam and irradiates the primary charged particle beam on the sample, and a deflector that is arranged above the objective lens and tilts the primary charged particle beam, the device that acquires a tilted image or a stereo pair image of the sample when irradiating on the sample the primary charged particle beam tilted by using a swing-back action of the objective lens, wherein an aligner is further included between the objective lens and the deflector, and the aligner has a beam tilt field-of-view compensation function to compensate a field-of-view deviation of the sample occurring upon tilting the primary charged particle beam based on the tilt angle of the deflector, the condition of the plurality of lenses, and the distance from the objective lens to the sample.

Further, the charged particle beam device has a tilted focus compensation function to compensate continuously and simultaneously, in response to a surface tilt of the sample, a focus of the objective lens and a field-of-view deviation due to the tilted primary charged particle beam while the primary charged particle beam is scanned on one line on the sample.

Further, a charged particle beam device includes a charged particle source, a sample stage, a plurality of lenses that converge a primary charged particle beam emitted from the charged particle source and form a crossover on an optical axis, an objective lens that converges the primary charged particle beam and irradiates the primary charged particle beam on a sample placed on the sample stage, and a deflector that is arranged between the objective lens and the crossover, and tilts the primary charged particle beam, wherein an aligner for compensating field-of-view is further included between the objective lens and the deflector, and the aligner for compensating field-of-view compensates a tilt angle of the primary charged particle beam such that displacement from the optical axis of a virtual crossover formed in a position different from the crossover by tilting the primary charged particle beam through the deflector accords with the optical axis.

Further, a charged particle beam device includes a charged particle source, a sample stage, a tilt mechanism that tilts the stage, a plurality of lenses that converge a primary charged particle beam emitted from the charged particle source and form a crossover on an optical axis, a scan coil that scans the primary charged particle beam on a sample placed on the sample stage, an objective lens that converges the primary charged particle beam and irradiates the primary charged particle beam on the sample, a deflector that is arranged between the objective lens and the crossover and tilts the primary charged particle beam, a control CPU that controls the units; and an image display device that is connected to the control CPU, wherein an aligner for compensating field-of-view is further included between the objective lens and the deflector, and when irradiating the primary charged particle beam on the surface of the sample placed on the sample stage tilted by the tilt mechanism and observing a tilted image, the control CPU controls the scan coil so as to scan the primary charged particle beam in a tilt direction of the tilted sample stage, the objective lens so as to focus the scanned primary charged particle beam on the surface of the sample, and the aligner for compensating field-of-view so as to accord the displacement from the optical axis of a virtual crossover formed in a position different from the crossover with the optical axis by tilting the primary charged particle beam through the deflector and by changing the focus position of the primary charged particle beam through the objective lens, and compensate the tilt angle of the primary charged particle beam.

Advantageous Effects of Invention

According to the present invention, when including the aligner that compensates the field-of-view deviation, there can be provided a charged particle beam device in which the field-of-view deviation occurring by tilting the primary charged particle beam can be easily compensated, and further the charged particle beam device in which the field-of-view deviation is suppressed and a preferable stereoscopic image is acquired. In addition, when providing the tilted focus compensation function to compensate continuously and simultaneously, in response to the tilted surface of the sample, the focus of the objective lens and the field-of-view deviation due to the tilted primary charged particle beam while the primary charged particle beam is scanned on one line on the sample, there can be provided the charged particle beam device in which the predetermined position can be observed through the tilted charged particle beam even if the sample is tilted.

Other objects, features and advantages of the invention will become apparent from the following description of the embodiments of the invention taken in conjunction with the accompanying drawings.

DESCRIPTION OF EMBODIMENTS

In the present invention, a primary charged particle beam emitted from a charged particle source is converged by a plurality of lenses, the primary charged particle beam is tilted by an electromagnetic coil above an objective lens, and the charged particle beam tilted by using a swing-back action of the objective lens is scanned on a sample. Further, in a charged particle beam device that acquires a tilted image or a left-right parallax-angle image of the sample, by using an aligner that is installed between the objective lens and the electromagnetic coil, a field-of-view deviation of the sample occurring when tilting the charged particle beam is dynamically compensated in conjunction with a compensation amount derived from a focus change of the objective lens based on a tilt angle of the electromagnetic coil, conditions of the plurality of lenses, and a distance from the objective lens to the sample.

Through the above configuration, when observing a tilted image of a tilted sample and a stereoscopic image, a preferable stereoscopic image and tilted image of the tilted sample can be observed without a field-of-view deviation.

Hereinafter, embodiments of the present invention will be described with reference to the accompanying drawings.

First Embodiment

Figure 1:
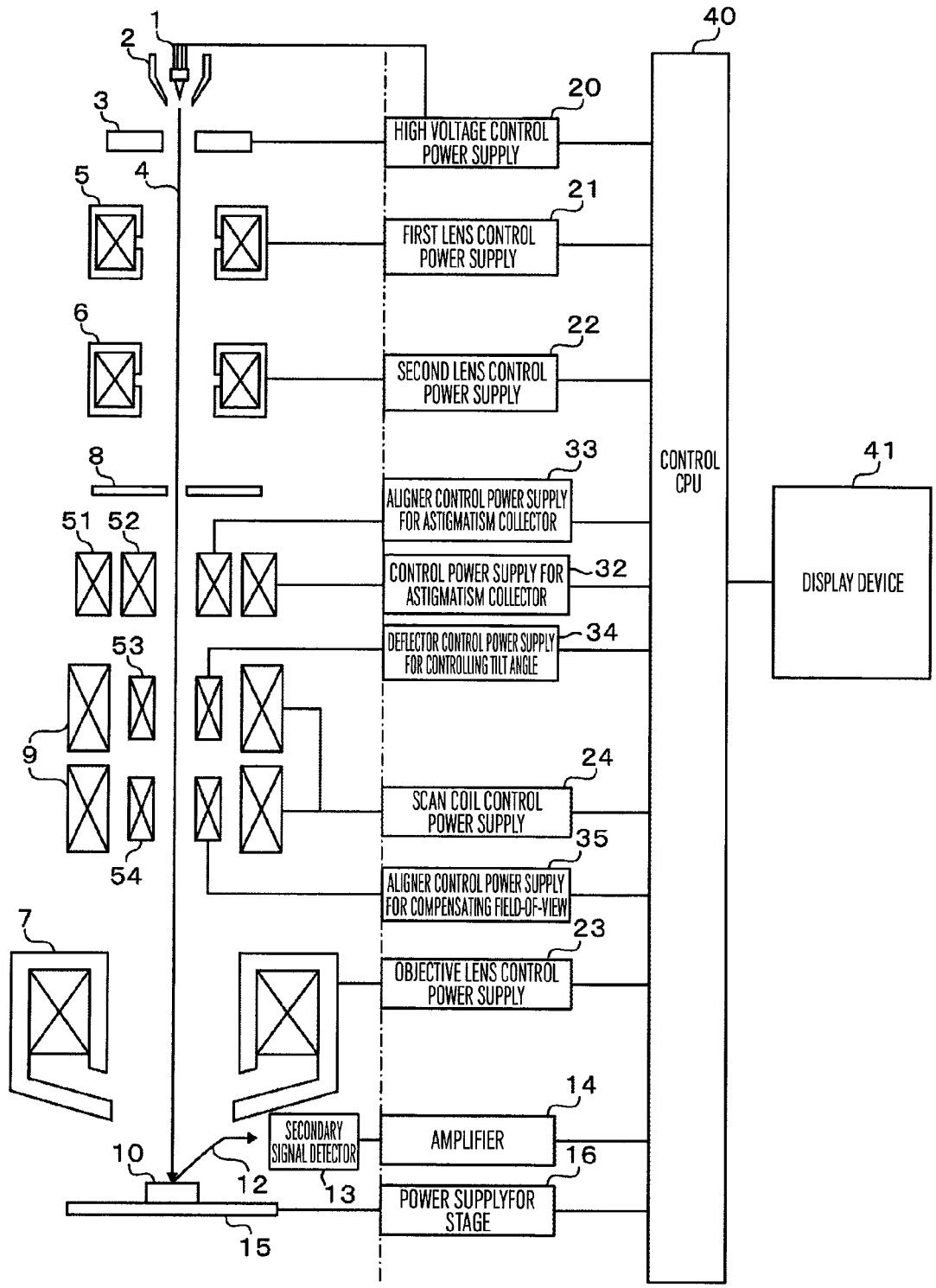
FIG. 1 is an overall schematic block diagram of a scanning electron microscope being one example of a charged particle beam device according to a first embodiment.

A first embodiment will be described with reference to FIGS. 1 to 5. FIG. 1 is a schematic block diagram of a scanning electron microscope being one example of a charged particle beam device according to the present embodiment. Here, an example of using the electron beam will be described, and further the first embodiment can be applied also to a case of using an ion beam. Note that the same reference numerals indicate the same elements. To a filament (cathode) 1 and an anode 3, a voltage is applied by a high voltage control power supply 20 controlled by a control CPU 40, and a primary electron beam 4 is drawn from the filament 1 at a predetermined emission current. In addition, the components that are directly or indirectly connected to the control CPU 40 of FIG. 1 are controlled by the control CPU 40. Between the filament 1 and the anode 3, an acceleration voltage is applied by the high voltage control power supply 20 that is controlled by the CPU 40. The primary electron beam 4 emitted from the cathode (filament) 1 is accelerated and proceeds to a lens system of a subsequent stage. In addition, a reference numeral 2 denotes a Wehnelt. The primary electron beam 4 is converged by first and second convergent lenses 5 and 6 that are controlled by first and second lens control power supplies 21 and 22. Unwanted regions of the primary electron beam are removed by an aperture plate 8, and then the primary electron beam 4 is converged as a small spot on a sample 10 by an objective lens 7 that is controlled by an objective lens control power supply 23.

The primary electron beam 4 is two-dimensionally scanned over the sample 10 by a scan coil 9 having two upper and lower stages. A reference numeral 24 denotes a scan coil control power supply. After proceeding to a bottom part of the objective lens 7, a secondary signal 12 such as a secondary electron generated from the sample 10 irradiated by the primary electron beam is detected by a secondary signal detector 13. The signal detected by the secondary signal detector 13 is amplified by a signal amplifier 14, and then is displayed as a sample image on an image display device 41.

Between the objective lens 7 and the aperture plate 8, an 8-pole astigmatism compensator 51 for compensating astigmatism in the X and Y directions is arranged. A reference numeral 32 denotes a control power supply for astigmatism compensator. An aligner for astigmatism compensator that compensates an axis deviation of an astigmatism compensator 52 is arranged in the same position or near the astigmatism compensator 52. A reference numeral 33 denotes an aligner control power supply for astigmatism compensator.

When the sample 10 to be observed is placed on the sample stage 15 and the sample stage 15 is moved, an observation field-of-view can be changed. The sample stage 15 can be moved manually or electrically. As the moving direction, the direction of the optical axis can be set to the Z direction and the sample can be rotated around the optical axis as a rotation axis other than the three directions of XYZ. It is possible to set the plane vertical to the optical axis to 0° and also tilt the sample 10 therefrom. In this embodiment, the sample stage is driven by using a stage drive unit and a power supply 16.

Figure 2:
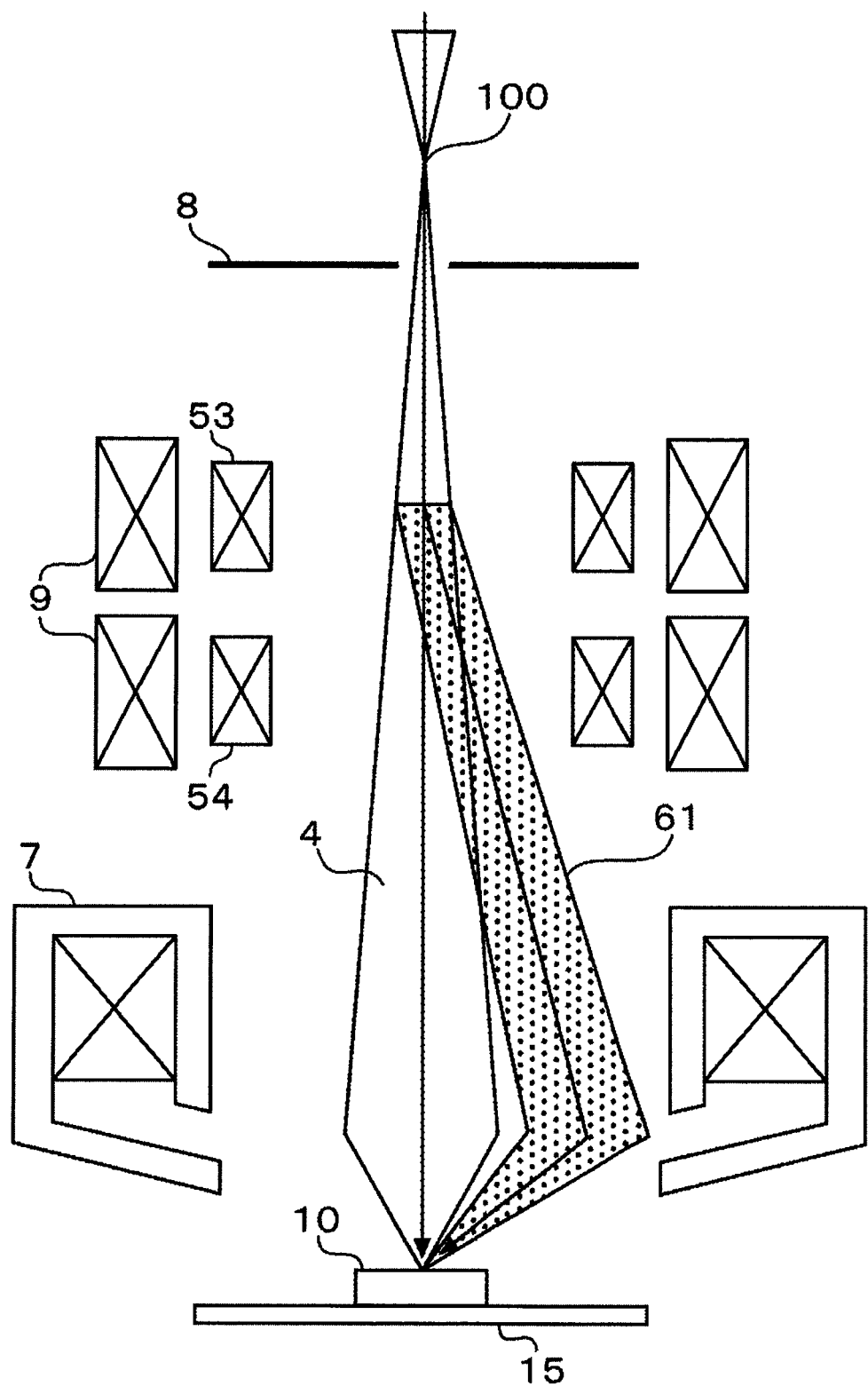
FIG. 2 illustrates a trajectory of an electron beam when observing a tilted image.

Next, tilted image observation and stereoscopic image observation will be described with reference to FIGS. 2 and 3. FIG. 2 illustrates a trajectory of an electron beam when observing the tilted image, and FIG. 3 illustrates a trajectory of the electron beam when observing the stereoscopic image.

A deflector for controlling tilt angle 53 is arranged in the same position of the upper stage of a scan coil 9, and the primary electron beam 4 is tilted when observing the tilted image and the stereoscopic image. The primary electron beam 4 is tilted and irradiated on the sample 10 by using a swing-back action of the objective lens 7. A reference numeral 34 denotes a deflector control power supply for controlling tilt angle.

In FIG. 2, not only a central trajectory of the primary electron beam 4 but also spread of the electron beam is illustrated. The primary electron beam 4 that is drawn from the filament 1 and passes through the first and second convergent lenses 5 and 6 forms a crossover 100 on the optical axis. Further, the primary electron beam 4 passes through the aperture plate 8 and is tilted by the deflector for controlling tilt angle 53. The tilted electron beam 61 passes through the outside of the axis of the objective lens 7, and is tilted from the optical axis and irradiated on the sample 10 by using the swing-back action of the objective lens 7, thereby acquiring the tilted image.

Figure 3:
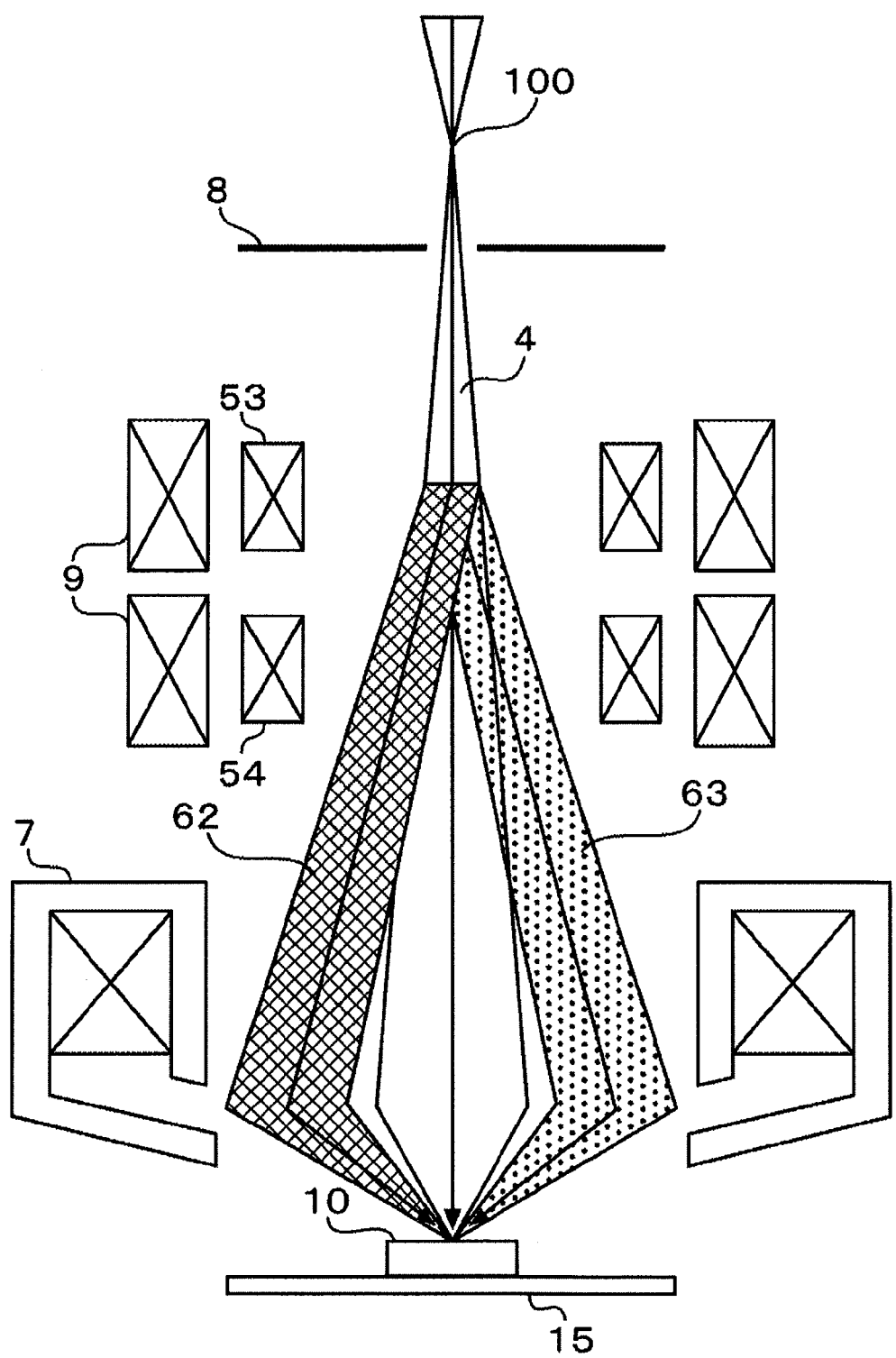
FIG. 3 illustrates a trajectory of an electron beam when observing a stereoscopic image.

As illustrated in FIG. 3, when observing a stereoscopic image, the primary electron beam 4 forms the crossover 100 similarly to the above, and passes through the aperture plate 8. Thereafter, two tilted electron beams 62 and 63 on the left and right are formed with respect to the optical axis set as the axis of symmetry by the deflector for controlling tilt angle 53, and a stereo pair image of left and right is acquired. The acquired image is image-processed by the control CPU 40 and displayed on a stereoscopic display monitor (image display device 41), thereby observing a stereoscopic image.

Figure 4:
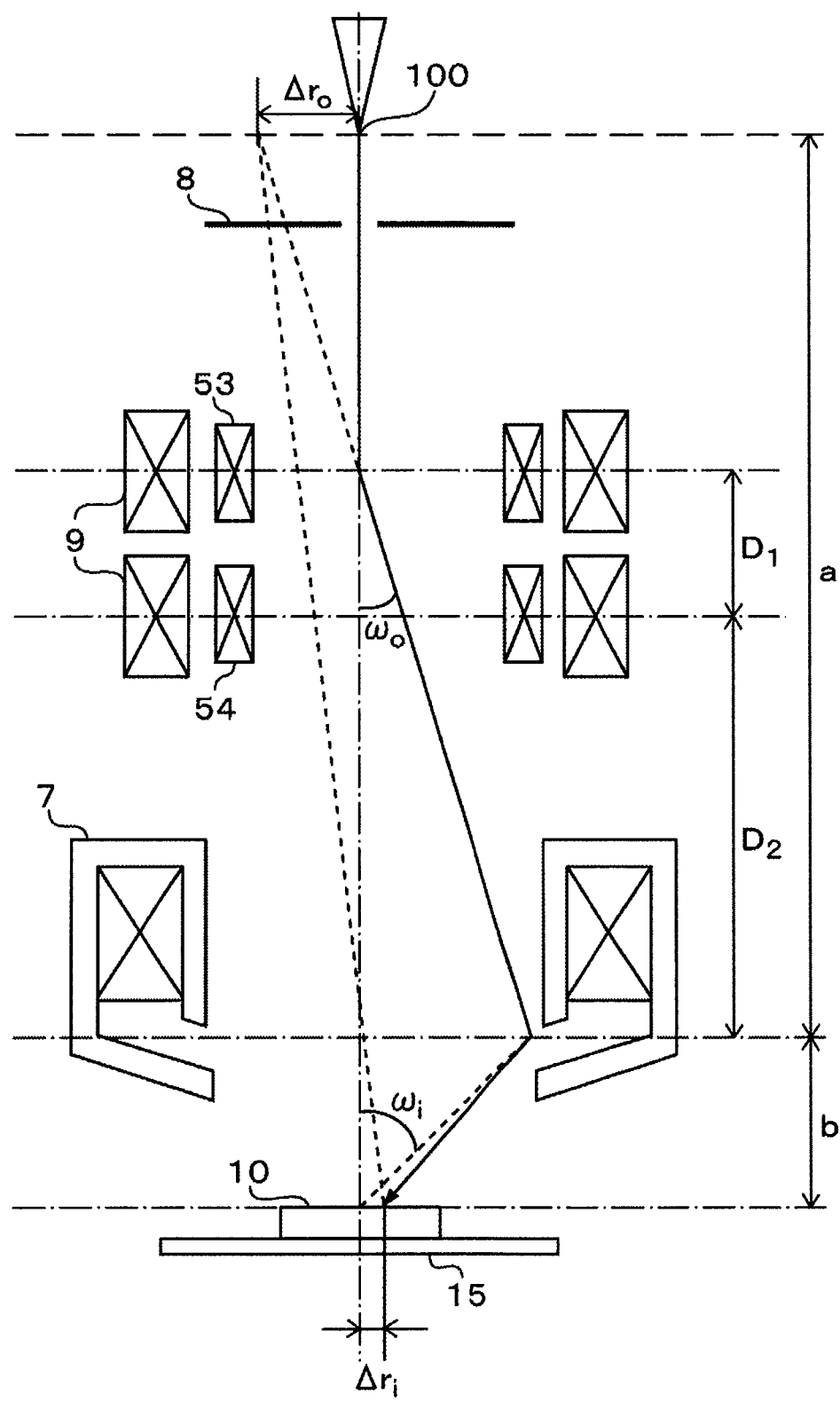
FIG. 4 illustrates an occurrence mechanism of a field-of-view deviation due to an electron beam tilt.

Next, an occurrence mechanism of a field-of-view deviation when tilting the electron beam will be described with reference to FIG. 4. FIG. 4 illustrates the occurrence mechanism of the field-of-view deviation due to an electron beam tilt. For simplicity, an electron beam center trajectory in which a deflection signal for scanning is not received will be here described.

The electron beam passing through the second convergent lens 6 forms the crossover 100 above the deflection coil (scan coil) 9 and the deflector for controlling tilt angle 53. Next, the electron beam is intended to be irradiated on the sample 10 at an angle of $\omega_i$ [rad]. The electron beam is deflected at an angle of $\omega_o$ [rad] by the deflector for controlling tilt angle 53, and irradiated on the sample 10 by using the swing-back action of the objective lens. However, the point reached by the electric beam is not located on the optical axis, but shifted by a distance $\Delta r_i$ from the optical axis.

The reason is that as shown in FIG. 4, the crossover 100 of the tilted electron beam is virtually shifted by a distance $\Delta r_0$ from the optical axis by the deflector for controlling tilt angle 53. In the optical system arrangement of FIG. 4, a displacement distance $\Delta r_i$ is determined as follows based on a geometric calculation.

[MATH. 1]

$$\Delta r_i = M_{obj} \Delta r_0 \qquad (1)$$

Here, $M_{obj}$ and $\Delta r_0$ are as follows.

[MATH. 2]

$$m_{obj} = b/a \qquad (2\text{-}1)$$

$$\Delta r_o = \omega_o(a - D_1 - D_2) \qquad (2\text{-}2)$$

$$\omega_o = \frac{b\omega_i}{D_1 + D_2} \qquad (2\text{-}3)$$

The displacement distance $\Delta r_i$ changes by a, b, and $\omega_i$, in particular, by $\omega_i$. A displacement distance of several tens of μm occurs even for $\omega_i$ of 10° or less. The displacement distance cannot be ignored even in the observation of magnification of several hundred times. Here, a represents a distance to the objective lens from the crossover, b represents a distance to the observation sample surface from the objective lens, and $D_1$ represents a distance to the aligner for compensating field-of-view 54 from the deflector for controlling tilt angle 53.

Figure 5:
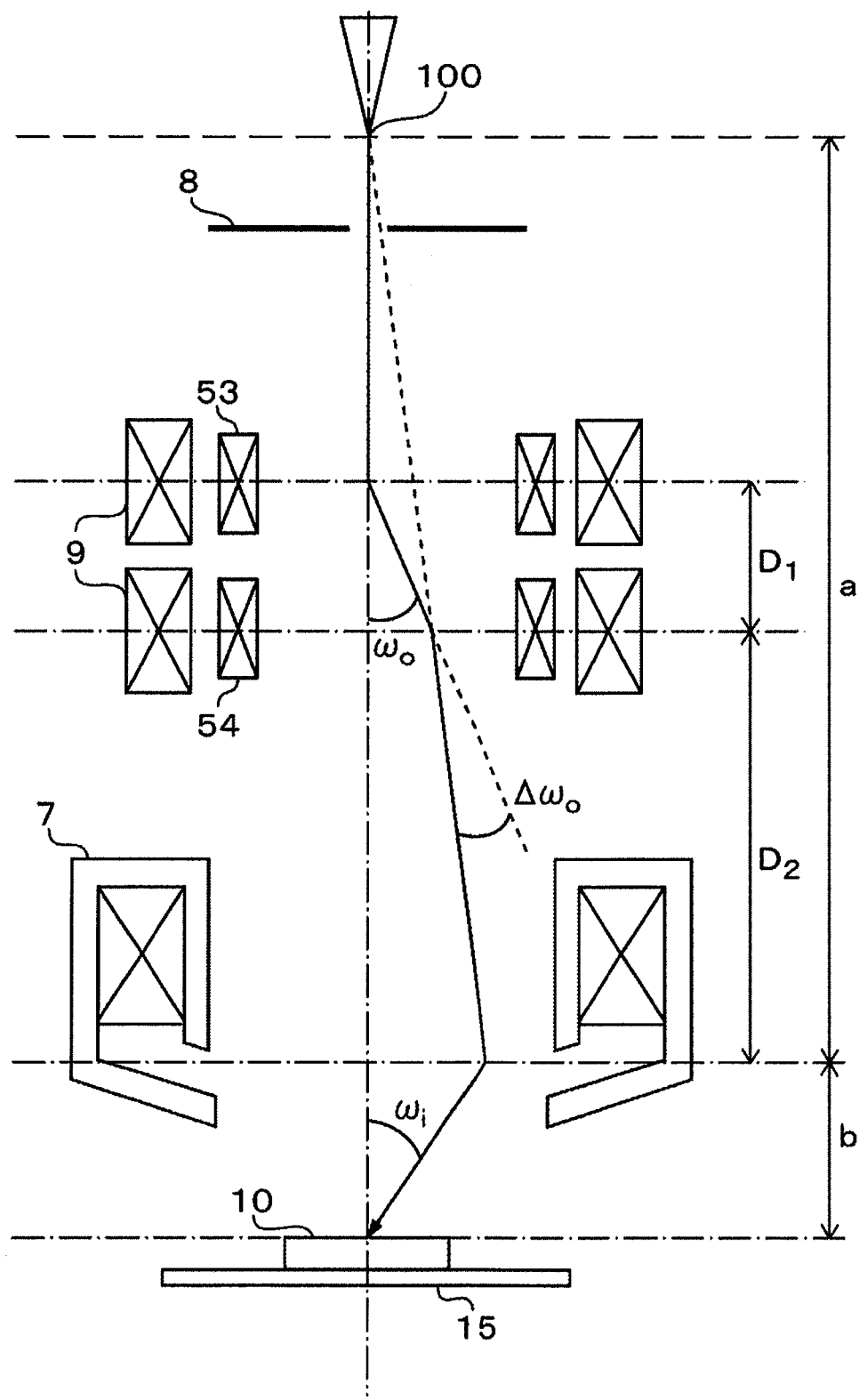
FIG. 5 illustrates a method for compensating the field-of-view deviation due to the electron beam tilt.

Next, a method for compensating the field of view will be described with reference to FIG. 5. FIG. 5 illustrates a method for compensating the field of view due to the electron beam tilt. The field of view is compensated by using the aligner for compensating field-of-view 54. Specifically, a tilted electron beam deflected by an angle $\omega_o$ is deflected by a compensation angle $\Delta\omega_o$ [rad] by using the deflector for controlling tilt angle 53. Further, the crossover virtually shifted by a distance $\Delta r_0$ from the optical axis is compensated so as to accord with the optical axis. A reference numeral 35 denotes an aligner control power supply for compensating field-of-view. In addition, with respect to the displacement from the optical axis of a virtual crossover, when a distance $\Delta r_0$ is ±200 µm or less, the crossover can be considered to accord with the optical axis.

In the optical system arrangement of FIG. 5, the compensation angle $\Delta\omega_0$ is determined as follows based on the geometric calculation.

[MATH. 3]

$$\Delta\omega_o = \omega_o\left(1 - \frac{D_1}{a - D_2}\right) = \frac{b\omega_i}{D_1 + D_2}\left(1 - \frac{D_1}{a - D_2}\right) \quad (3)$$

Based on the above equation, the field-of-view deviation when observing the tilted electron beam can be suppressed by using the aligner for compensating field-of-view 54. In reality, when the aligner is an electromagnetic coil, the signal given to the aligner for compensating field-of-view 54 is a current, so that a current according to the compensation angle is supplied.

Even if the angle $\omega_i$ and the distance a are determined under certain observation conditions, the compensation angle $\Delta\omega_0$ changes depending on the distance b according to Equation (3) (distances D1 and D2 are device-specific dimension constants).

By using the charged particle beam device including the aligner for compensating field-of-view, the charged particle beam is tilted above the objective lens, and the crossover virtually shifted from the optical axis is compensated so as to accord with the optical axis, and a sample is observed. As a result, a tilted image of a desired position can be observed in the observation field-of-view even at a high magnification of 1000 times or more.

In addition, the stereoscopic observation of cells, metal crystals, or powder is performed by using the charged particle beam device. As a result, a preferable stereoscopic image can be acquired without shifting the observation positions on the left and right.

As described above, according to the present embodiment, by including the aligner for compensating field-of-view, even if the primary electron beam is tilted and a sample is observed, the charged particle beam device in which a field-of-view deviation can be easily compensated can be provided. Further, even when a stereo pair image of left and right is acquired by using two tilted charged particle beams of left and right with respect to the optical axis set as the axis of symmetry, the charged particle beam device in which the field-of-view deviation is suppressed and a preferable stereoscopic image is acquired can be provided.

Second Embodiment

Figure 6:
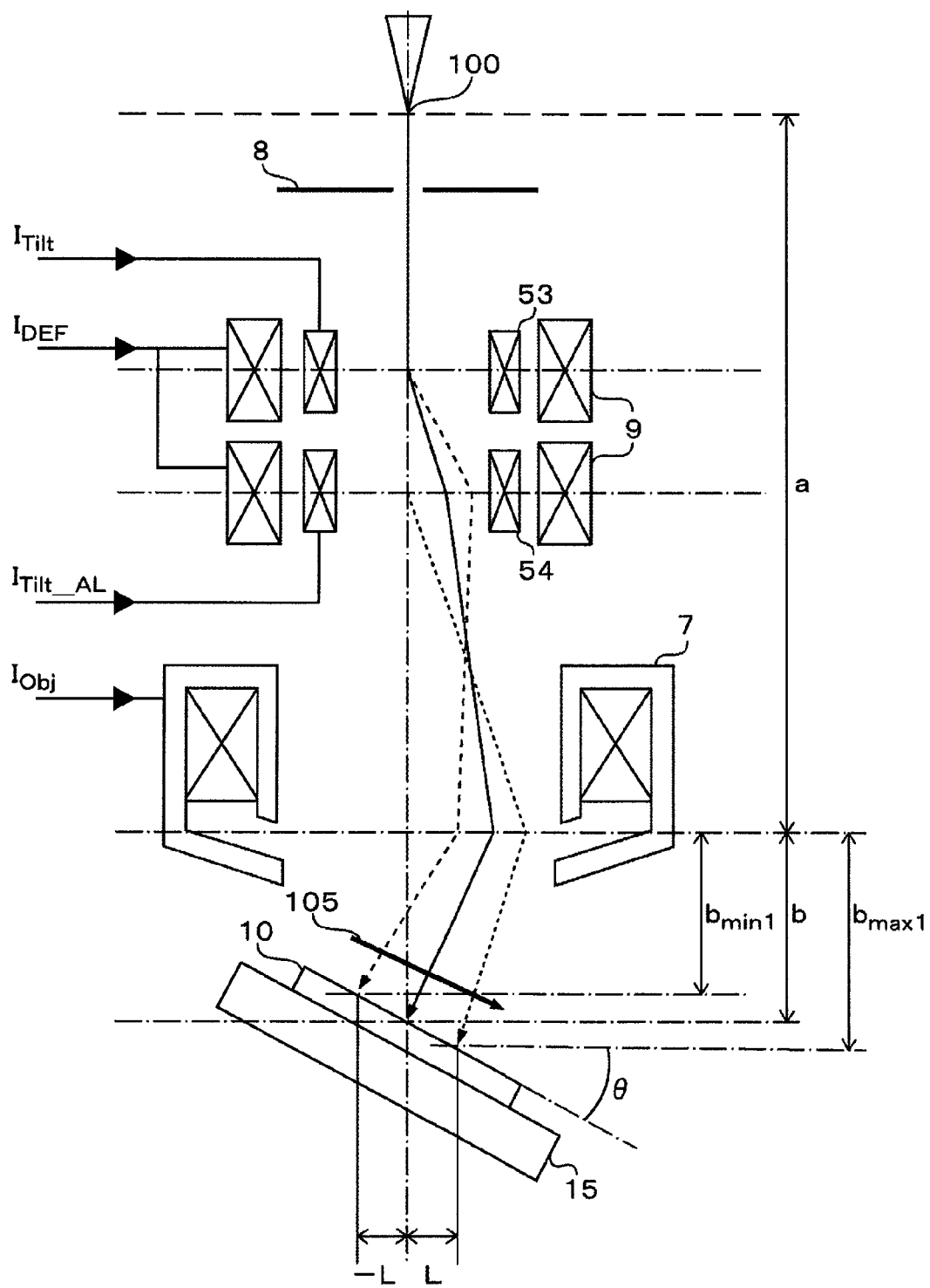
FIG. 6 illustrates a trajectory of a charged particle beam when observing a tilted beam on the tilted surface of a sample by using a charged particle beam device according to a second embodiment.
Figure 7:
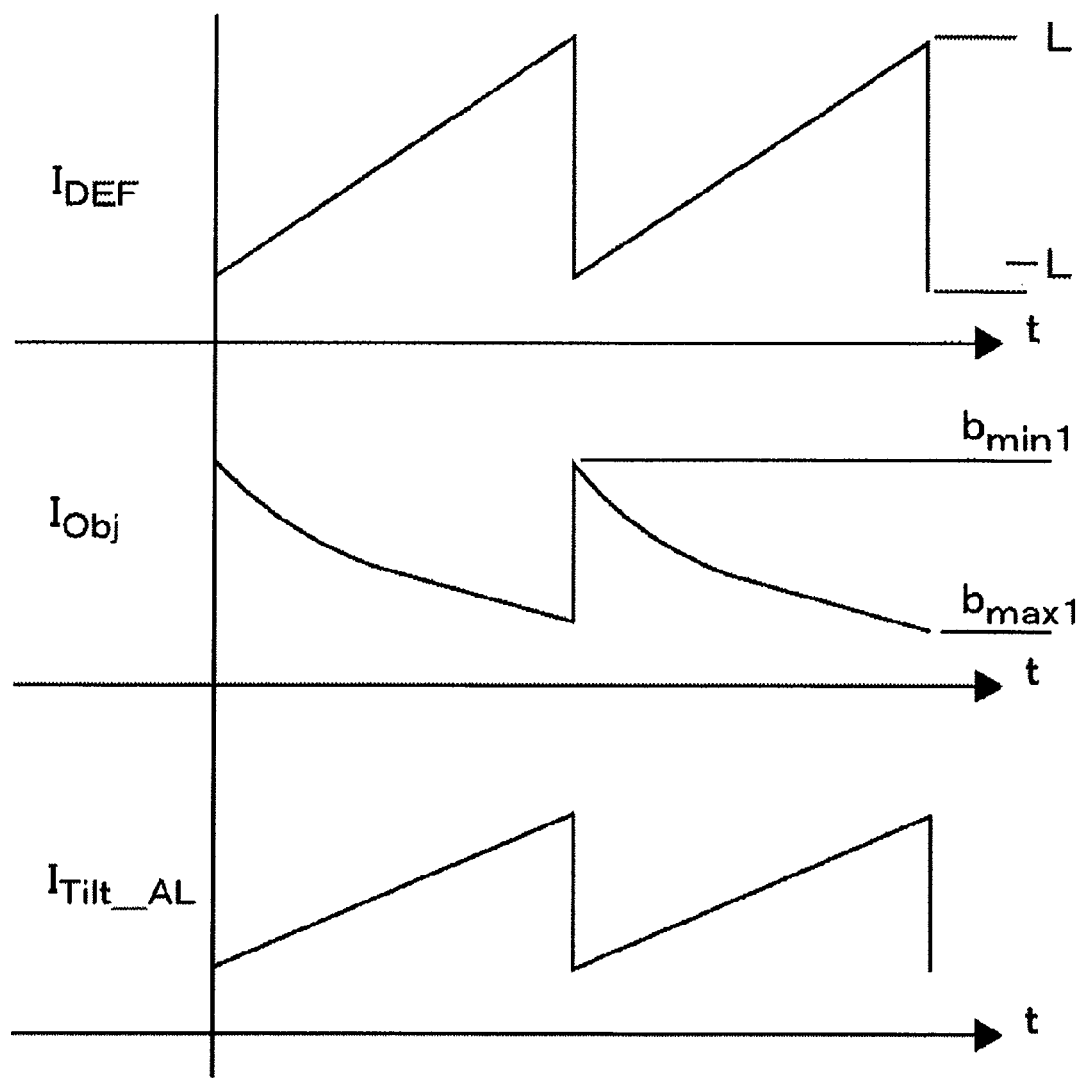
FIG. 7 is a signal time chart when simultaneously compensating a focus and a field-of-view deviation.

A second embodiment will be described with reference to FIGS. 6 to 10. In addition, the matters that are described in the first embodiment and not yet described in the present embodiment can be applied to the present embodiment as long as there are no special circumstances. FIG. 6 illustrates a trajectory of a charged particle beam when observing a tilted beam to a surface of a tilted sample by using a charged particle beam device (scanning electron microscope) according to the present embodiment. FIG. 7 is a signal time chart when simultaneously compensating a focus and a field-of-view deviation.

As shown in FIG. 6, with respect to the sample 10 which shows a significant sample surface tilt θ and in which a tilted axis of the sample stage 15 is moved, tilted focus compensation in which a focus is continuously changed according to the sample surface tilt θ is used. In this case, the field-of-view deviation also needs to be continuously compensated simultaneously by using the aligner for compensating field-of-view 54. The sample stage 15 can be tilted at an angle of −20° to 90° with respect to the horizontal plane (plane vertical to the optical axis). In addition, a reference numeral 105 denotes a scanning direction of the primary electron beam. Further, $b_{min1}$ represents a minimum distance between the objective lens and the sample surface in the observation field-of-view when scanning the primary electron beam, and $b_{max1}$ represents a maximum distance therebetween.

A control diagram of various signals at this time is illustrated as FIG. 7. In FIG. 7, $I_{DEF}$ represents a deflection signal to be supplied to the scan coil 9 from the scan coil control power supply 24 in order to scan the primary electron beam, $I_{obj}$ represents an objective lens signal to be supplied to the objective lens from the objective lens control power supply in order to converge the primary electron beam to the sample surface, $I_{Tilt\_AL}$ represents an aligner control signal for compensating field-of-view to be supplied to the aligner for compensating field-of-view from the aligner control power supply for compensating field-of-view in order to compensate a displacement from the optical axis of a virtual crossover, and $I_{Tilt}$ represents a deflector signal for controlling tilt angle. Since a height position of a sample to be observed changes according to a deflection signal $I_{DEF}$ of the upper stage, the objective lens signal $I_{obj}$ of the middle stage is changed by a tilted focus compensation. Further, since a virtual crossover position changes in conjunction with the focus compensation, the aligner control signal for compensating field-of-view $I_{Tilt\_AL}$ is also changed. In FIG. 7, as the deflection signal $I_{DEF}$ advances (the primary electron beam is scanned 105 to the right direction in the drawing), the sample is lowered, and therefore the objective lens current $I_{obj}$ is reduced as the property of the objective lens (the objective lens focus property is non-linear, and has a trend as shown in FIG. 7). In conjunction with the above, since b increases ($b_{min1} \rightarrow b_{max1}$), the aligner control signal for compensating field-of-view $I_{Tilt\_AL}$ gradually increases according to Equation (3). These are carried out by using the control CPU.

Note, however, that in this case, since the deflection signal $I_{DEF}$ is not changed according to the sample tilt, the range in which the tilted sample is subjected to a scan width is different as compared to the scan range (±L) in the case where the sample is not tilted, and is different also in an apparent magnification.

In the field-of-view deviation compensation through the aligner for compensating field-of-view 54, when the tilted magnification compensation is simultaneously used in addition to the tilted focus compensation, it becomes further convenient. The tilted magnification compensation is a technique to prevent a change in the magnification of the image before and after the sample tilt, and is carried out by changing the scan range of the scan coil 9 according to the tilt angle of the sample. A change in the scan range for the tilted magnification compensation is performed by using the control CPU.

By combining the above functions, in the observation of a tilted image on a tilted sample and a stereoscopic image, the scan range and the magnification can be maintained while adjusting the focus of them, and then the observation can be performed without a field-of-view deviation.

Figure 8:
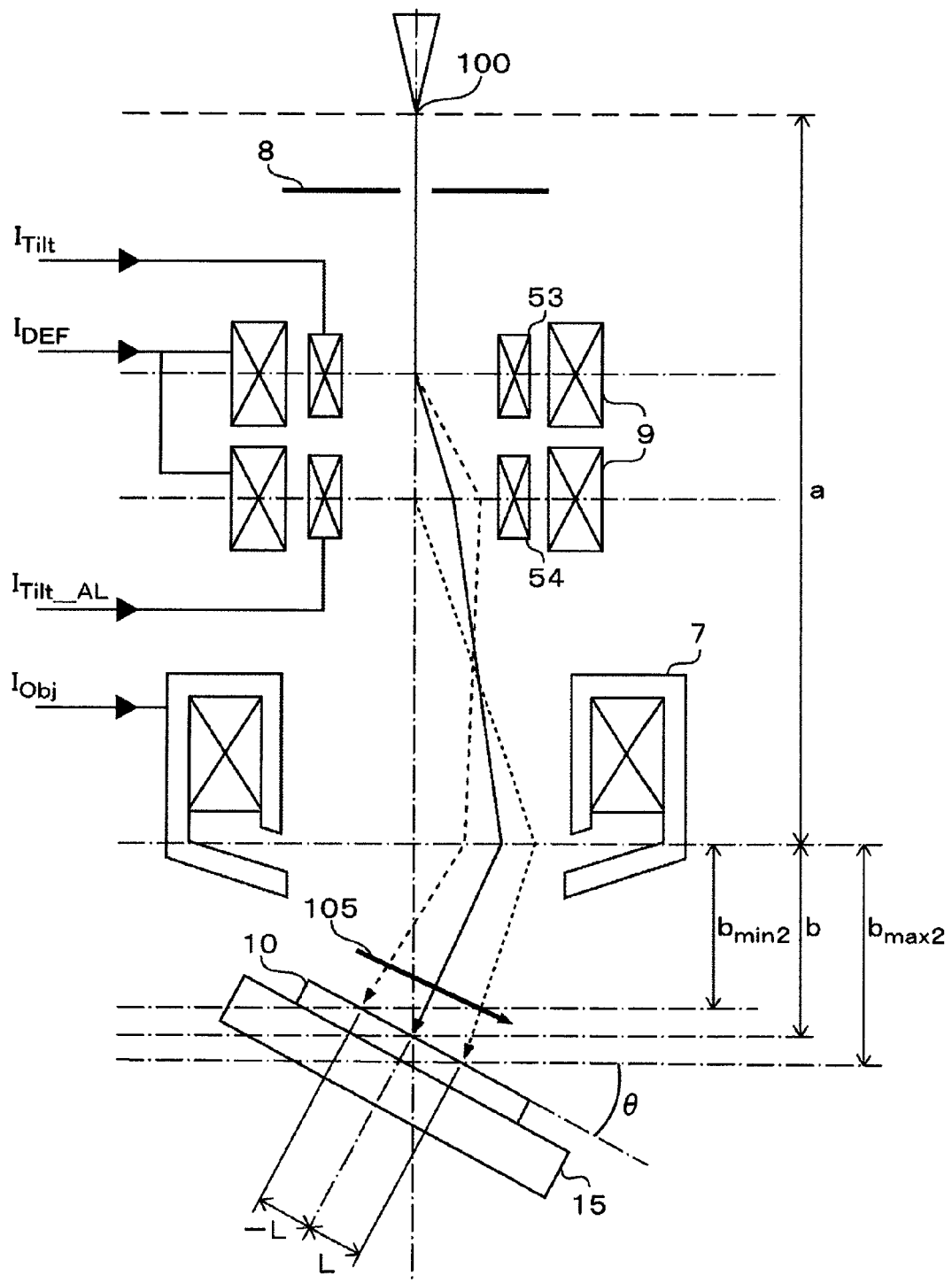
FIG. 8 illustrates a trajectory of a charged particle beam when observing a tilted beam (when compensating a tilted magnification) on a tilted sample by using the charged particle beam device according to the second embodiment.
Figure 9:
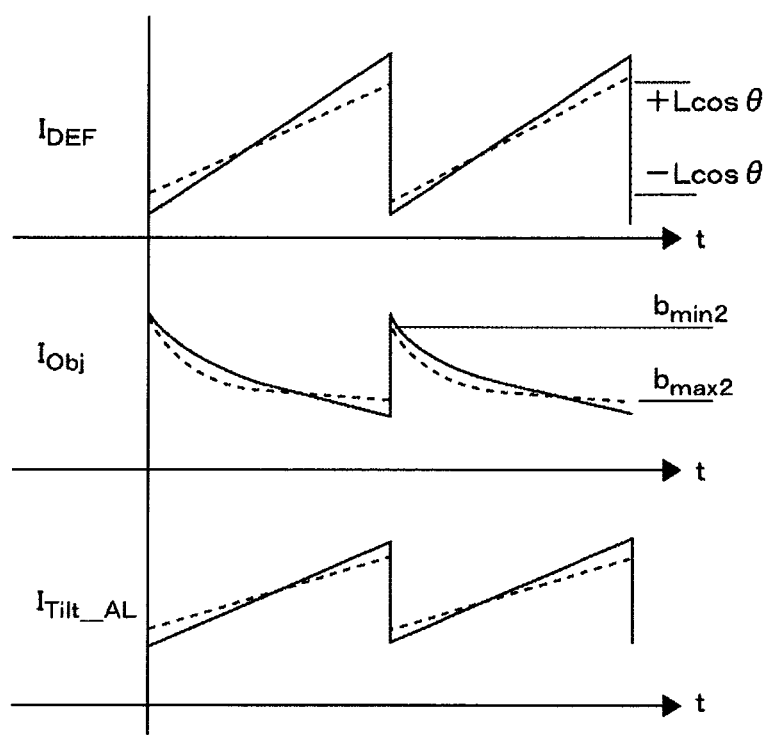
FIG. 9 is a signal time chart when simultaneously compensating a focus, a field-of-view deviation, and a magnification.

Next, a method for performing not only the field-of-view deviation compensation but also a tilted magnification compensation when performing the tilted focus compensation will be described with reference to FIGS. 8 and 9. FIG. 8 illustrates a trajectory of the charged particle beam when observing a tilted beam on the tilted sample while performing the tilted magnification compensation, and FIG. 9 is a signal time chart when simultaneously compensating the focus, the field-of-view deviation, and the magnification. Note that in FIG. 9, the solid lines indicate a case where the magnification compensation is performed, and broken lines indicate a case where the magnification compensation is not performed.

By using the tilted magnification compensation function, on a sample surface tilted at a tilt angle θ, the deflection signal $I_{DEF}$ is controlled and scanned in the scan range ±L equal to that before the tilt. When referring to the change in the control signal in that case, the deflection width is increased on the left side of the optical axis and is decreased on the right side of the optical axis by using a center height (b) of the sample as a reference. However, a difference between variations on the left and right sides of the scan width is as small as less than 2%, and actually there is no problem in replacing both of the variations on the left and right sides with L cos θ obtained by multiplying the scan width L before using the tilted magnification function and the cosine cos θ of the tilt angle θ. Simultaneously with the above, the focus compensation signal and the field-of-view deviation compensation signal are also compensated.

Figure 10:
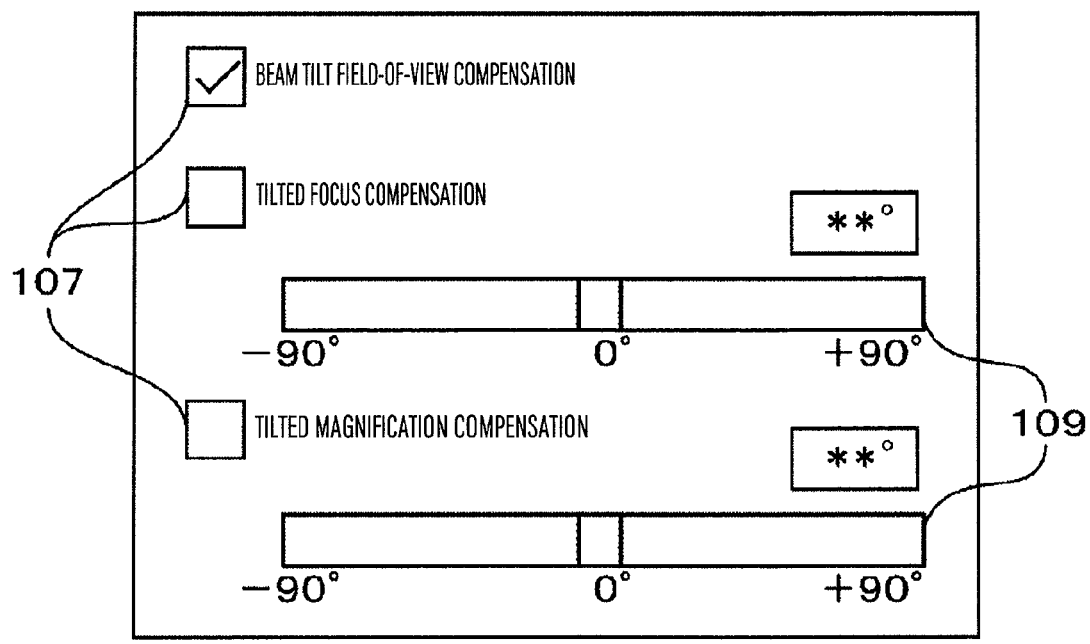
FIG. 10 illustrates one example of an operation GUI of the charged particle beam device according to the second embodiment.

Next, a GUI screen about a displacement compensation of the charged particle beam device according to the present embodiment will be described with reference to FIG. 10. FIG. 10 illustrates one example of a user input screen in the scanning electron microscope according to the present embodiment. From FIG. 10, by checking the check box 107, the user can use three functions of a "beam tilt field-of-view compensation" being a field-of-view deviation compensation, a "tilted focus compensation", and a "tilted magnification compensation". These functions can be used either individually or in a plural combination of them. The slider 109 is attached to the "tilted focus compensation" and the "tilted magnification compensation", and the user determines the tilt angle of the sample.

By using the charged particle beam device according to the present embodiment, a semiconductor device is tilted and a tilted image is observed while performing the tilted focus compensation. On this occasion, the sample is observed while compensating a displacement so as to accord a crossover virtually shifted from the optical axis with the optical axis according to the tilted focus compensation. As a result, a preferable oblique-view image can be acquired in a predetermined position. Further, as a result of performing the displacement compensation and the magnification compensation according to the tilted focus compensation, an image with higher dimensional accuracy can be acquired.

As described above, according to the present embodiment, when including the aligner for compensating field-of-view, even if the sample is tilted such that the tilted focus compensation is performed, displacement is suppressed. Therefore, the charged particle beam device capable of observing a predetermined position can be provided. Further, when having the tilted focus compensation function, an oblique-view image with high dimensional accuracy can be acquired.

In addition, the present invention is not limited to the above-described embodiments, but includes various modifications. For example, the above-described embodiments are described in detail in order to clearly describe the present invention, and are not necessarily limited to the device having all the described constructions. Further, a part of constructions according to one embodiment can be replaced by those according to other embodiment, and the constructions according to other embodiment can be added to that according to one embodiment. Further, an addition, deletion, or replacement of the constructions according to other embodiment can be performed by using a part of the constructions according to each embodiment.

REFERENCE SIGNS LIST

1 Filament (cathode)
2 Wehnelt
3 Anode
4 Primary electron beam
5 First convergent lens
6 Second convergent lens
7 Objective lens
8 Aperture plate
9 Scan coil
10 Sample
12 Secondary signal
13 Detector for secondary signal
14 Signal amplifier
15 Sample stage
16 Stage drive unit and power supply
20 High voltage control power supply
21 First convergent lens control power supply
22 Second convergent lens control power supply
23 Objective lens control power supply
24 Scan coil control power supply
32 Control power supply for astigmatism collector
33 Aligner control power supply for astigmatism collector
34 Deflector control power supply for controlling tilt angle
35 Aligner control power supply for compensating field-of-view
40 Control CPU
41 Display monitor
51 Astigmatism collector
52 Aligner for astigmatism collector
53 Deflector for controlling tilt angle
54 Aligner for compensating field-of-view
61 Tilted electron beam
62 Left-side tilted electron beam
63 Right-side tilted electron beam
100 Crossover
105 Scanning direction
107 Check box
109 Slider

The invention claimed is:

1. An image acquiring method including the steps of:
providing a charged particle source and generating a primary charged particle beam using the charged particle source;
utilizing a plurality of convergent lenses for converging the primary charged particle beam which is emitted from the charged particle source along an optical axis of the charged particle beam device;
providing a scan coil for scanning the primary charged particle beam on a sample;
using an objective lens for converging the primary charged particle beam and for irradiating the primary charged particle beam on the sample;
providing a sample table for receiving and supporting the sample;

arranging a deflector above the objective lens and using the deflector for tilting the primary charged particle beam, the charged particle beam device being usable for acquiring a stereo pair image of the sample by irradiating on the sample;

tilting the primary charged particle beam by using a swing-back action of the objective lens, the deflector moving a virtual crossover of the primary charged particle beam to a position out of the optical axis when tilting the primary charged particle beam, locating an aligner between the objective lens and the deflector with the aligner having a beam tilt field-of-view compensation function for compensating a tilt angle ($\omega 0$) of the primary charged particle beam by a compensation angle $\Delta\omega_0$, such that a distance $\Delta r_o$ between a virtual crossover of the primary particle beam and the optical axis is in a predetermined range, and makes a field-of-view of the left and right stereo pair image of a sample surface coincident by compensating the tilt angle of the primary charged particle beam, providing a tilting mechanism and using the tilting mechanism for tilting the sample on the sample table;

utilizing a tilted focus compensation function for compensating a focus of the objective lens and simultaneously compensating the tilt angle ($\omega 0$) of the primary charged particle beam in response to a surface tilt of the sample on the sample table and using the aligner for compensating for a field-of-view deviation while the primary charged particle beam is scanned on one line on the sample;

adapting the charged particle beam device for acquiring a stereo pair image of the sample tilted by the tilting mechanism; and increasing a first signal for the aligner, and decreasing a second signal for the objective lens as a function of the advancing of a deflection signal for the scan coil.

2. The image acquiring method of claim 1, further including providing a tilted magnification compensation function for changing a scan width simultaneously with the focus compensation of the objective lens and the field-of-view deviation compensation due to the tilted primary charged particle beam and scanning the primary charged particle beam on the same region function as that of a case where the sample surface is not tilted.

3. The image acquiring method of claim 2, further including providing an image display device, wherein the image display device displays a GUI screen including an input unit that is capable of performing at least one of the beam tilt field-of-view compensation, the tilted focus compensation, and the tilted magnification compensation.

4. The image acquiring method of claim 1, further including providing the beam tilt field-of-view compensation function for compensating the tilt angle ($\omega 0$), such that the predetermined range of the distance $\Delta r_o$ between the virtual crossover and the optical axis is ±200 μm or less.

5. The image acquiring method of claim 1, further including using the scan coil for scanning the primary charged particle beam in a scan range equal to that before the tilt.

6. An image acquiring method including the steps of:

providing a charged particle source and emitting a charged particle beam using the charged particle source;

utilizing a plurality of convergent lenses for converging the charged particle beam along an optical axis of the charged particle beam device;

providing a scan coil for scanning the charged particle beam on a sample;

utilizing an objective lens for converging the charged particle beam on the sample;

providing a deflection system arranged above the objective lens for tilting the charged particle beam;

using the deflection system for forming a distance between a virtual crossover of the charged particle beam and the optical axis during tilting of the charged particle beam;

including a beam tilt field-of-view compensation function for compensating a tilt angle ($\omega_0$) of the charged particle beam by a compensation angle $\Delta\omega_0$, such that a distance $\Delta r_o$ between the virtual crossover of the primary charged particle beam and the optical axis is in a predetermined range;

providing a tilting mechanism and using the tilting mechanism for tilting the sample, and which forms a sample surface tilt;

using a tilted focus compensation function for compensating a focus of the objective lens as a function of the sample surface tilt and simultaneously using the beam tilt field-of-compensation function for compensating the tilt angle ($\omega_0$) of the charged particle beam;

providing a processing unit which acquires a stereo pair image of the sample tilted by the tilting mechanism; and increasing a first signal for the deflection system and decreasing a second signal for the objective lens as a function of the advancing of a deflection signal for the scan coil.

7. The image acquiring method of claim 6, further including the beam tilt field-of-view compensation function for compensating the tilt angle ($\omega_0$), such that the predetermined range of the distance $\Delta r_o$ between the virtual crossover and the optical axis is ±200 μm or less.

8. The image acquiring method of claim 6, further comprising conducting a tilted magnification compensation by changing a scan range of the scan coil as a function of the tilted focus compensation function.

* * * * *